United States Patent [19]

Ketley et al.

[11] 4,120,721

[45] Oct. 17, 1978

[54] RADIATION CURABLE COMPOSITIONS FOR COATING AND IMAGING PROCESSES AND METHOD OF USE

[75] Inventors: Arthur Donald Ketley, Columbia, Md.; Paul Richard Hein; Michael Wen-Chien Yang, both of Marietta, Ga.

[73] Assignee: W. R. Grace & Co., New York, N.Y.

[21] Appl. No.: 802,706

[22] Filed: Jun. 2, 1977

[51] Int. Cl.² .............................................. B05D 3/06
[52] U.S. Cl. ...................................... 96/36.3; 427/44; 427/54; 204/159.22
[58] Field of Search ..................... 427/54; 204/159.22; 96/36.3; 260/859

[56] References Cited

U.S. PATENT DOCUMENTS

| | | | |
|---|---|---|---|
| 3,297,745 | 1/1967 | Fekete et al. | 260/471 |
| 3,509,234 | 4/1970 | Burlant et al. | 260/859 |
| 3,697,621 | 10/1972 | Kehr et al. | 260/858 |
| 3,850,770 | 11/1974 | Juna et al. | 96/36.3 |
| 3,898,349 | 8/1975 | Kehr et al. | 427/54 |
| 3,908,039 | 9/1975 | Guthrie et al. | 427/54 |

*Primary Examiner*—John H. Newsome
*Attorney, Agent, or Firm*—Richard P. Plunkett; William W. McDowell, Jr.

[57] ABSTRACT

This invention relates to a liquid radiation curable composition useful for coating and imaging which comprises (1) an acrylic or methacrylic terminated, urethane containing polyene, (2) a non-water soluble vinyl monomer diluent, preferably an acrylate or methacrylate monomer diluent, (3) a polythiol containing at least two thiol groups per molecule and (4) a photoinitiator.

The composition on exposure to radiation, e.g., a U.V. light source, cures to a solid polythioether.

8 Claims, No Drawings

RADIATION CURABLE COMPOSITIONS FOR COATING AND IMAGING PROCESSES AND METHOD OF USE

This invention relates to radiation curable compositions suitable for coating and imaging processes such as the manufacture of printing plates.

Photopolymerizable systems using acrylate terminated components have, in the past, had the disadvantage of poor stability and their tendency to be air-inhibited.

Surprisingly, we have now found that these drawbacks can be overcome with a photocurable system comprising (1) an acrylic or methacrylic terminated, urethane containing polyene, (2) a non-water soluble vinyl monomer diluent, preferably an acrylate or methacrylate monomer diluent, (3) a polythiol containing at least two thiol groups per molecule and (4) a photoinitiator.

The composition on exposure to radiation, e.g., a U.V. light source, cures to a solid polythioether.

The acrylic or methacrylic terminated, urethane containing polyene component of the instant invention is prepared by reacting a diisocyanate monomer with an ethylenically unsaturated alcohol in an amount such that one stoichiometric equivalent of free isocyanate groups remain in the reaction product and, thereafter, reacting said free isocyanate groups with the stoichiometric equivalent of the hydroxyl groups in a polyhydric alcohol, preferably polyethylene glycol and polypropylene glycol of the formula:

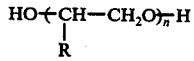

wherein $n$ is 1 to 100 and R is hydrogen or a methyl group. The diisocyanates operable herein to form the polyene include 1,5-naphthalene diisocyanate; cumene-2,4-diisocyanate; 4-methoxy-1,3-phenylene diisocyanate; 4-chloro-1,3-phenylene diisocyanate; 4-bromo-1,3-phenylene diisocyanate; 4-ethoxy-1,3-phenylene diisocyanate; 2,4'-diisocyanato diphenyl ether; 5,6-dimethyl-1,3-phenylene diisocyanate; 2,4-dimethyl-1,3-phenylene diisocyanate; 4,4'-diisocynato diphenyl ether; benzidine diisocyanate; 4,6-dimethyl-1,3-phenylene diisocyanate; 9,10-anthracene diisocyanate; 4,4'-diisocyanato dibenzyl, 3,3'-dimethyl-4,4'-diisocyanato diphenyl; 2,4-diisocyanatostilbene, 3,3'-dimethyl-4,4'-diisocyanato phenyl methane; 3,3'-dimethoxy-4,4'-diisocyanato diphenyl; 1,4-anthracene diisocyanate; 2,5-fluorene diisocyanate; 1,8-napthalene diisocyanate, 2,6-diisocyanato benzfuran; amyl benzene-2,4-diisocyanate; hexyl benzene-2,4-diisocyanate; dodecyl benzene-2,4-diisocyanate; butyl benzene-2,4-diisocyanate; polymethylene diisocyanates, such as tetramethylene diisocyanate, pentamethylene diisocyanate, hexamethylene diisocyanate; cycloalkylene diisocyanates, such as cyclohexylene-1,4-diisocyanate; 4,4'-methylene bis(cyclohexyl isocyanate); isophorone diisocyanate; hetero chain diisocyanates, such as (O=C=NCH$_2$CH$_2$)$_2$O.

The ethylenically unsaturated alcohols operable herein to form the polyene are polymerizable acrylate esters or methacrylate esters having a hydroxyl group and include, but are not limited to 2-hydroxyethyl acrylate; 2-hydroxyethyl methacrylate; 2-hydroxypropyl acrylate; 2-hydroxypropyl methacrylate; 2-hydroxybutyl acrylate; 2-hydroxybutyl methacrylate; 2-hydroxyoctyl acrylate; 2-hydroxyoctyl methacrylate; 2-hydroxydodecanyl acrylate; 2-hydroxydodecanyl methacrylate; 2-hydroxy-3-chloropropyl acrylate; 2-hydroxy-3-chloropropyl methacrylate; 2-hydroxy-3-acryloxypropyl acrylate; 2-hydroxy-3-acryloxypropyl methacrylate; 2-hydroxy-3-methacryloxypropyl acrylate; 2-hydroxy-3-methacryloxypropyl methacrylate; 2-hydroxy-3-allyloxypropyl acrylate; 2-hydroxy-3-allyloxypropyl methacrylate; 2-hydroxy-3-cinnamylpropyl acrylate; 2-hydroxy-3-cinnamylpropyl methacrylate; 2-hydroxy-3-phenoxypropyl acrylate; 2-hydroxy-3-phenoxypropyl methacrylate; 2-hydroxy-3-(o-chlorophenoxy)propyl acrylate; 2-hydroxy-3-(o-chlorophenoxy)propyl methacrylate; 2-hydroxy-3-(p-chlorophenoxy) propyl acrylate;; 2-hydroxy-3-(p-chlorophenoxy)propyl methacrylate; 2-hydroxy-3-(2,4-dichlorophenoxy)propyl acrylate; 2-hydroxy-3-(2,4-dichlorophenoxy)propyl methacrylate; 2-hydroxy-3-acetoxypropyl acrylate; 2-hydroxy-3-acetoxypropyl methacrylate; 2-hydroxy-3-propionoxypropyl acrylate; 2-hydroxy-3-propionoxypropyl methacrylate; 2-hydroxy-3-chloroacetoxypropyl acrylate; 2-hydroxy-3-chloroacetoxypropyl methacrylate; 2-hydroxy-3-dichloroacetoxypropyl acrylate; 2-hydroxy-3-dichloroacetoxypropyl methacrylate; 2-hydroxy-3-trichloroacetoxypropyl acrylate; 2-hydroxy-3-trichloroacetoxypropyl methacrylate; 2-hydroxy-3-benzoxypropyl acrylate; 2-hydroxy-3-benzoxypropyl methacrylate; 2-hydroxy-3-(o-chlorobenzoxy)propyl acrylate; 2-hydroxy-3-(o-chlorobenzoxy)propyl methacrylate; 2-hydroxy3-(p-chlorobenzoxy)propyl acrylate; 2-hydroxy-3-(p-chlorobenzoxy)propyl methacrylate; 2-hydroxy-3-(2,4-dichlorobenzoxy)propyl acrylate; 2-hydroxy-3-(2,4-dichlorobenzoxy) propyl methacrylate; 2-hydroxy-3-(3,4-dichlorobenzoxy) propyl acrylate; 2-hydroxy-3-(3,4-dichlorobenzoxy)propyl methacrylate; 2-hydroxy-3-(2,4,6-trichlorophenoxy)propyl acrylate; 2-hydroxy-3-(2,4,6-trichlorophenoxy)propyl methacrylate; 2-hydroxy-3-(2,4,5-trichlorphenoxy)propyl acrylate; 2-hydroxy-3-(2,4,5-trichlorphenoxy)propyl methacrylate; 2-hydroxy-3-(o-chlorophenoxyacetoxy)propyl acrylate; 2-hydroxy-3-(o-chlorophenoxyacetoxy)propyl methacrylate; 2-hydroxy-3-phenoxyacetoxypropyl acrylate; 2-hydroxy-3-phenoxyacetoxypropyl methacrylate; 2-hydroxy-3-(p-chlorophenoxyacetoxy)propyl acrylate; 2-hydroxy-3-(p-chlorophenoxyacetoxy)propyl methacrylate; 2-hydroxy-3-(2,4-dichlorphenoxyacetoxy)propyl acrylate; 2-hydroxy-3-(2,4-dichlorphenoxyacetoxy)propyl methacrylate; 2-hydroxy-3-(2,4,5-trichlorophenoxyacetoxy)propyl acrylate; 2-hydroxy-3-(2,4,5-trichlorphenoxyacetoxy)propyl methacrylate; 2-hydroxy-3-crotonoxpropyl acrylate; 2-hydroxy-3-crotonoxypropyl methacrylate; 2-hydroxy-3-cinnamyloxypropyl acrylate; 2-hydroxy-3-cinnamyloxypropyl methacrylate.

The formation of this type of polyene is well known to those skilled in the art and is set out in U.S. Pat. No. 3,297,745 and U.S. Pat. No. 3,850,770, both patents incorporated herein by reference.

The amount of acrylic or methacrylic terminated, urethane containing polyene in the radiation curable composition can be varied between broad limits. Amounts of the polyene ranging from 10 to 80, preferably 40 to 60 based on the weight of the composition are operable herein. Examples of the non-water soluble acrylate or methacrylate monomer diluent include, but are not limited to, bisphenol-A diacrylate; bisphenol-A dimethacrylate; diethylene glycol diacrylate; diethylene glycol dimethacrylate; ethylhexyl acrylate; ethylhexyl methacrylate; 1,6-hexanediol diacrylate; 1,6-hexandiol dimethacrylate; neopentyl glycol diacrylate; neopentyl glycol dimethacrylate; pentaerythritol tetraacrylate; pentaerythritol triacrylate; polyethylene glycol diacrylate; polyethylene glycol dimethacrylate; tetraethylene glycol diacrylate; tetraethylene glycol dimethacrylate; triethylene glycol diacrylate; triethylene glycol dimethacrylate; trimethylolpropane triacrylate; trimethylolpropane trimethacrylate. Other non-water soluble vinyl monomer diluents include vinyl acetate; vinyl propionate; N-vinylpyrrolidone; diallyl adipate; diallyl maleate and diallyl malate.

These diluents are reactive in the photocuring step and can be added separately or as mixtures of diluents. Additionally, an acrylate monomer diluent can be added to a composition containing a methacrylate terminated polyene and vice versa. The amount of diluent added to the photocurable composition can vary between wide limits. Generally, 20 to 80% by weight of the composition and preferably 40 to 60 weight percent is added.

In practicing the instant invention, the polyenes must contain two or more terminal reactive unsaturated carbon to carbon bonds/molecule and have a viscosity ranging from essentially 0 to 20 million centipoises at 70° C. Included in the term "polyenes" as used herein are those materials which in the presence of an inert solvent, thinner or plasticizer fall within the viscosity range set out about at 70° C. Operable polyenes and reactive diluents in the instant invention have molecular weights in the range 50 to 20,000, preferably 1000 to 5000. The polyenes and reactive diluents herein will, when exposed to radiation, react with thiol groups in the polythiol to yield the thioether linkage

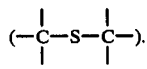

As used herein, the term polythiols refers to simple or complex organic compounds having a multiplicity of pendant or terminally positioned -SH functional groups per average molecule.

The polythiols must contain 2 or more -SH groups/molecule. They usually have a viscosity range of slightly above 0 to about 20 million centipoises (cps) at 70° C, as measured by a Brookfield Viscometer. Included in the term "polythiols" as used herein are those materials which in the presence of reactive plasticizers such as diallyl phthalate fall within the viscosity range set out about at 70° C. Operable polythiols in the instant invention usually have molecular weights in the range about 94 to about 20,000 or more, preferably about 100 to about 10,000.

The polythiols operable in the instant invention can be exemplified by the general formula: $R_8$—$(SH)_n$ where n is at least 2 and $R_8$ is a polyvalent organic moiety free from "reactive" carbon to carbon unsaturation. Thus, $R_8$ may contain cyclic groupings and minor amounts of hetero atoms such as N, S, P or O but, primarily, contains carbon-hydrogen, carbon-oxygen or silicone-oxygen containing chain linkages free of any "reactive" carbon to carbon unsaturation.

One class of polythiols operable in the instant invention to obtain essentially odorless cured polythioether coatings and relief images are esters of thiol containing acids of the general formula: HS—$R_9$—COOH where $R_9$ is an organic moiety containing no "reactive" carbon to carbon unsaturation with polyhydroxy compounds of the general structure: $R_{10}$—$(OH)_n$ where $R_{10}$ is an organic moiety containing no "reactive" carbon to carbon unsaturation and n is 2 or greater. These components will react under suitable conditions to give a polythiol having the general structure:

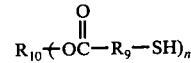

where $R_9$ and $R_{10}$ are organic moieties containing no "reactive" carbon to carbon unsaturation and n is 2 or greater.

Certain polythiols such as the aliphatic monomeric polythiols (ethane dithiol, hexamethylene dithiol, decamethylene dithiol, tolylene-2,4-dithiol, etc.) and some polymeric polythiols such as thiol-terminated ethylcyclohexyl dimercaptan polymer, etc. and similar polythiols which are conveniently and ordinarily synthesized on a commercial basis, although having obnoxious odors, are operable in this invention. Examples of the polythiol compounds preferred for this invention because of their relatively low odor level and fast curing rate include but are not limited to esters of thioglycolic acid (HS—CH$_2$COOH), α-mercaptopropionic acid (HS—CH (CH$_3$)—COOH and β-mercaptopropionic acid (HS—CH$_2$CH$_2$COOH) with polyhydroxy compounds such as glycols, triols, tetraols, penatols, hexaols, etc. Specific examples of the preferred polythiols include but are not limited to ethylene glycol bis(thioglycolate), ethylene glycol bis (β-mercaptopropionate), trimethylolpropane tris(thioglycolate, trimethylolpropane tris(β-mercaptopropionate), pentaerythritol tetrakis (thioglycolate) and pentaerythritol tetrakis (β-mercaptopropionate), all of which are commercially available. A specific example of a preferred polymeric polythiol is polypropylene ether glycol bis (β-mercaptopropionate) which is prepared from polypropylene-ether glycol (e.g. Pluracol P2010, Wyandotte Chemical Corp.) and β-mercaptopropionic acid by esterification.

The preferred polythiol compounds are characterized by a low level of mercaptan-like odor initially, and after reaction, give essentially odorless cured polythioether end products which are commercially useful resins or elastomers for coating and imaging end uses.

The amount of the polythiol added to the radiation curable composition is in the range 0.1 to 35, preferably 2 to 10 weight percent of the composition.

The curing reaction can be initiated by either U.V. radiation or high energy ionizing radiation. The U.V. radiation can be obtained from sunlight or special light sources which emit significant amounts of U.V. light having a wavelength in the range of about 2000 to about 4000 Angstrom units. Any type of actinic light from any source may be used in carrying out the method of this invention. For liquid photocurable compositions, it is preferred that the light emanate from a point source or in the form of parallel rays but divergent beams are also operable as a source of actinic light.

Various light sources may be used to obtain sufficient actinic radiation to practice the method of this invention. Such sources include carbon arcs, mercury arcs, fluorescent lamps with special ultraviolet light emitting phosphors, xenon arcs, sunlight, tungsten halide lamps, argon glow lamps, photographic flood lamps, lasers and the like. When U.V. radiation is used for the curing reaction, a dose of 0.0004 to 60 watts/centimeter$^2$ is employed.

When U.V. radiation is used for curing, a photoinitiator is added to the composition to increase the reaction rate.

Various photoinitiators are operable and well known to those skilled in the art. Examples of photoinitiators include, but are not limited to, benzophenone, acetophenone, acenaphthene-quinone, methyl ethyl ketone, valerophenone, hexanophenone, α-phenylbutyrophenone, p-morpholinopropiophenone, dibenzosuberone, 4-morpholinobenzophenone, 4'morpholinodeoxybenzoin, p-diacetylbenzene, 4-aminobenzophenone, 4'-methoxyacetophenone, benzaldehyde, α-tetralone, 9-acetylpenanthrene, 2-acetylphenanthrene, 10-thioxanthenone, 3-acetylphenanthrene, 3-acetylindole, 9-fluorenone, 1-indanone, 1,3,5-triacetylbenzene, thioxanthen-9-one, xanthene-9-one, benzoin isobutyl ether, chloroxanthone, benzoin tetrahydropyranyl ether, benzoin methyl ether, benzoin isopropyl ether, 7-H-benz-[de]anthracene-7-one, 1-napthaldehyde, 4,4'-bis(dimethylamino)benzophenone, fluorene-9-one, 1'-acetonaphthone, 2'-acetonaphthone, o-methoxybenzophenone, triphenylphosphine, tri-o-tolylphosphine, benz[a]anthracene 7,12 dione, 2,2-diethoxyacetophenone, 2,2-dimethoxy-2-phenylacetophenone and 2,3-butanedione, etc., which service to give greatly reduced exposure times and thereby, when used in conjunction with various forms of energetic radiation, yield very rapid, commercially practical time cycles by the practice of the instant invention. The photoinitiators are usually added in an amount ranging from 0.01 to 10% by weight of the photocurable composition.

The radiation curable compositions of the instant invention can also be cured by high energy ionizing irradiation. A preferred feature of the ionizing irradiation operation of the instant invention is treatment with high energy particle irradiation or by gamma-rays or X-rays. Irradiation employing particles in the instant invention includes the use of positive ions, (e.g., protons, alpha particles and deuterons), electrons or neutrons. The charged particles may be accelerated to high speeds by means of various voltage gradient mechanisms such as a Van de Graaff generator, a cyclotron, a Cockroft Walton accelerator, a resonant cavity accelerator, a betatron, a G.E. resonant transformer, a synchrotron or the like. Furthermore, particle irradiation may also be supplied from radioactive isotopes or an atomic pile. Gamma rays or X-rays may be obtained from radiosotopes (e.g. cobalt 60) or by particle bombardment of suitable target material (e.g., high energy electrons on a gold metal target).

The dose rate for the irradiation operable to cure the coating in the instant invention is in the range 0.00001 to 1000 megarads/second.

The amount of ionizing radiation which is employed in curing the radiation curable material in the instant invention can vary between broad limits. Radiation dosages of less than a megarad up to 10 megarads or more for electrons are operable, preferably 0.02 to 5 megarads energy absorbed are employed. For gamma-rays or X-rays, radiation dosages in the range 0.0001 to 5.0 megarads energy absorbed are operable. The irradiation step is ordinarily performed under ambient temperature conditions but can be performed at temperatures ranging from below room temperature up to temperatures of 90° C.

When using ionizing radiation, the depth of penetration is dependent upon the density of the material to be penetrated. When the ionizing irradiation is in the form of electrons, 0.2 to 12 million electron volts (mev.) are usually employed. Where gamma-rays or X-rays are employed, a range of 0.01 to 5.0 million electron volts is used. As aforestated, if such penetration is not sufficient to cure the coating to the entire depth desired when beaming the radiation from one direction only, one may use multiple radiation sources beaming simultaneously or intermittently from diametrically opposite sides of the coating. Furthermore, shielding can also be employed to increase penetration of the coating on the opposite side away from the radiation source.

The compositions to be radiation cured, i.e., converted to coating, in accord with the present invention, may, if desired, include such additives as antioxidants, inhibitors, activators, fillers pigments, dyes, antistatic agents, flame-retardant agents, thickeners, thixotropic agents, surface-active agents, viscosity modifiers, plasticizers and the like within the scope of this invention. Such additives generally are preblended with the polyene or polythiol prior to formulating the photocurable composition. The aforesaid additives may be present in quantities up to 500 parts or more per 100 parts radiation curable composition by weight and preferably 0.0005 to 300 parts on the same basis. The type and concentration of the additives must be selected with care so that the final composition remains radiation curable under conditions of exposure.

The curing period may be retarded or accelerated from less than 1 minute to 30 days or more.

Conventional curing inhibitors or retarders which may be used in order to stabilize the components or curable compositions so as to prevent premature onset of curing may include hydroquinone; p-tert-butyl catechol; 2,6-di-tert-butyl-p-methylphenol; phenothiazine; N-phenyl-2-naphthylamine; phosphorous acid; pyrogallol and the like.

Conventional reaction promoters which give faster curing reaction rates and broaden the range of utilizable light wavelengths include trimethylphosphite, triethylphosphite, triphenylphosphite, rose bengal and acetone.

A convenient method of forming a printing plate from the composition of the present invention is to place an image-bearing, line or halftone, stencil or positive or negative transparency parallel to the surface of the photocurable composition which has been cast directly on a support or on a light-absorptive layer on the support. The image-bearing transparency and the surface of the photocurable composition may be in contact or have an airgap therebetween, as desired. The photocurable layer is exposed through the transparency to a source of actinic light until the photocurable layer is cured to an insoluble stage in the exposed areas. The thickness of the ultimate relief in such a process may be controlled by varying the thickness of the layer of the photocurable composition. The thus prepared plate may then be imaged and developed.

Development can be carried out by conventional means, e.g., removal of the uncured portion of the curable composition with a suitable solvent or liquid therefor, e.g., water and a detergent. Additionally, the uncured portion may be removed by an air knife, i.e., a mechanical apparatus which travels across the plate emitting a blast of pressurized air which blows the uncured liquid composition off the plate.

In making printing plates it is essential that the exposure be sufficient to harden the photocurable composition in the exposed image areas without causing significant curing in the non-image areas. Aside from exposure time and light intensity, the extent of the exposure is dependent on the thickness of the photocurable layer, the curing temperature, the polyene and polythiol employed, the photoinitiator, diluent, the presence of light absorbing pigments or dyes in the photocurable composition and the character of the image to be reproduced. In general, the thicker the layer to be cured, the longer the exposure time. It has been observed that curing starts at the surface of the photocurable layer closest to the light source and proceeds downward to the support. With insufficient exposure, the layer may have a hard cure at the surface but, through lack of a clear-through cure, the relief will be removed when the unexposed are is removed. Inasmuch as the curing rate usually increases at higher temperatures, less exposure is required thereat than at room temperature. Thus, ultraviolet light sources that emit heat are more efficient than cold ultraviolet light sources. However, care must be exercised that too high a temperature is not attained during the photocure, as this leads, in some cases, to thermal expansion of the photocurable composition which results in image distortion. Hence, it is preferred that the photocuring be carried out at a temperature in the range about 20° to about 70° C. Due to the number of variables which affect exposure time, optimum results are best determined by trial and error, e.g., stepped exposures with characterization after each exposure.

It has been found preferable to maintain an airgap between the photocurable composition and the image-bearing transparency. Such as airgap may range from about 0.1 mil to about 250 mils or more. The airgap facilitates removal of the image-bearing transparency from the vicinity of the cured composition after subjection to acting light without defacing the cured composition. Contact between the image-bearing transparency and the photocurable composition is operable, if desired. Thus, plate pressure printing frames may be used to maintain contact between the image-bearing transparency and the photocurable composition. If desired, separation of the image-bearing transparency from the cured composition may be facilitated after exposure by introducing a parting layer between the transparency and the photocurable composition. The parting layer may consist of a thin petrolatum or silicone film coated on the surface of the transparency, or a thin transparent film such as regenerated cellulose or cellulose ester, including cellulose acetate, cellulose propionate, polyethylene terephthalate and the like. After exposure the transparency may, if desired, be removed from contact with the cured or parting layer for reuse.

In general, the thickness of the layer to be photocured and employed as a printing plate may vary from about 0.1 to about 500 mils or more. For lithographic printing plates, the thickness may range between about 0.1 to about 5 mils; for letterset (dry offset) plates the thickness may be customarily about 5 to about 25 mils; for letterpress printing, thicknesses of about 15 to about 500 mils are common. For letterpress newspaper or magazine printing plates, the thickness of the photocured layer will be about 10 to about 50 mils. In intaglio, the depth of sunken wells varies from about 0.1 to about 5 mils. Thicker layers are sometimes employed for the flexographic printing of designs and relatively large areas with letterpress printing plates.

A supporting base material, i.e., the support, employed may be any natural or synthetic product capable of existence in film sheet or plate form and may be flexible or rigid, smooth or matte surface, reflective or non-reflective of actinic light. Metals, because of their greater strength in thinner form, are preferably employed as a support. However, where weight is critical plastic paper, or rubber is employed as the support. Additionally, the support layer may be the photocurable composition per se. That is, a portion of the photocurable composition may be poured into a mold and exposed directly to actinic light to solidify the entire layer of the photocurable composition. After solidification, this layer will serve as a support for an additional amount of the photocurable composition poured on top of the support, which additional amount would form the relief after exposure through an image-bearing transparency to actinic light. Another operable modification of the procedure is to cast the photocurable composition onto a transparent plate such as one made of glass, plastic and the like. Now the layer may be exposed non-imagewise from one side to form a solid base and imagewise through a transparency from the other side to give the relief image. These two exposures may be made simultaneously or in consecutive fashion as desired.

In those instances where rotary press plates are desired, the support material may be used to form flat relief plates which are then formed to the desired shape. Such rotary press plates may also be prepared by using cylindrically shaped support plates of the various types carrying the curable composition and exposing them directly to actinic light through a concentrically disposed image-bearing transparency.

Suitable metals for a support include steel, aluminum, magnesium, copper, chromium and the like. Additionally, various film-forming plastics may be used such as addition polymers, vinylidene polymers, e.g., vinyl chloride, vinylidene chloride copolymers with vinyl chloride, vinyl acetate, styrene, isobutylene and acrylonitrile, vinylchloride copolymers with the latter polymerizable monomers; the linear condensation polymers such as the polyesters, e.g., polyethylene terephthalate, the polyamides, e.g., polyhexamethylene sebacamide; polyester amides, e.g., polyhexamethyleneadipamide/adipate; and the like. Fillers or other reinforcing agents may be present in the synthetic resin or polymer support such as various fibers (synthetic, modified or natural), e.g., cellulosic fibers, such as cotton, cellulose acetate, viscose rayon and paper; glass wool; nylon and the like. These reinforced bases may be used in laminated form.

The following examples are set out to explain, but expressly not limit, the instant invention. Unless otherwise specified, all parts and percentages are by weight.

EXAMPLE 1

375 g of commercially available toluene diisocyanate was added to a 3 liter glass resin kettle together with 0.295 g stannous octoate catalyst. Commercially available hydroxypropyl methacrylate (308.8 g) was added at such a rate that the temperature did not exceed 60° C. After addition was complete, the reaction mixture was heated for 1 hour at 60° C and then a further 0.31 g of stannous octoate added. Polypropylene glycol having a molecular weight of about 1000 and commercially available from Union Carbide under the tradename "PPG 1025" (1288.2 g) was then added and heating at 60° C continued for 3 hours until the NCO dropped to zero. Stabilizer, i.e., 1.97 g of 2,6-di-tert butyl phenol was then added. The thus formed methacrylate terminated polyene will hereinafter be referred to as Prepolymer A.

EXAMPLE 2

42 lbs of commercially available toluene diisocyanate was charged to a 30 gallon glass reactor together with 15.0 g of stannous octoate. 163 g of triphenyl phosphite was then added followed by 31.4 lbs of hydroxypropyl acrylate at such a rate that the temperature did not exceed 60° C. A second addition of stannous octoate (17.0 g) was then made followed by 133 lbs of polypropylene glycol having a molecular weight of about 1000 and commercially available from Union Carbide under the tradename "PPG 1025".

The reaction mixture was heated at 60° C until no unreacted isocyanate could be detected. The thus formed acrylate-terminated polyene will hereafter be referred to as Prepolymer B.

EXAMPLE 3

803 parts of Prepolymer A from Example 1 was compounded with 281 parts of diethylene glycol dimethacrylate, 8.7 parts of triphenylphosphite, 10.9 parts of 2,2-dimethoxy-2-phenylacetophenone, 2.2 parts 2,6-di-tert butyl phenol and 54 parts of trimethyolpropane tris(3-mercaptopropionate). The mixture was then heated 1 hour at 60° C.

A 20 mil thick layer of this formulation was then doctored on to a 10 mil aluminum sheet coated with an adhesion promoting layer. The polymer was briefly exposed (5.88 sec.) to a U.V. source. A negative of a newspaper page was then held accurately above the photopolymer layer with a 15 mil air gap between the two. A second exposure (45 sec.) was then carried out through the negative using the same U.V. source. The imaged plate was then etched using a blast of compressed air which left a relief image of excellent fidelity suitable for printing.

EXAMPLE 4

307 lbs of Prepolymer B from Example 2 was compounded with 69 lbs of diethylene glycol dimethacrylate, 5.5 lbs of benzoin isobutyl ether and 627.5 g of triphenylphosphite. The mixture was heated for 1 hour at 60° C and then 7.2% based on the total weight in the reactor of the tetramercaptoproprionate ester of pentaerythritol was added, followed by 0.2% by weight of octadecyl-$\beta$-(4-hydroxy-3,5-di-t-butyl phenyl) propionate and 0.1% by weight of 2.6-di-tert-butyl-4-methyl phenol.

This material was used to prepare a printing plate as described in Example 3. A sharp relief image of excellent fidelity was obtained.

EXAMPLE 5

100 g of Prepolymer B from Example 2 was diluted with 80 g of diethylene glycol diacrylate. 0.48 g of triphenylphosphite, 0.20 g di-tert butyl phenol, 5.0 g of benzophenone, 1.0 g of methyldiethanolamine were then added and the mixture heated for 30 minutes at 60° C. 10 g of the trimercaptopropionate ester of trimethylol propane was then added together with 10 g of N-vinyl-2-pyrrolidone.

This material was then coated as a thin film over a conventional white base coat on steel can stock. The coating was cured at 150 ft./min. in a Radiant Products U.V. oven using three 200 watts/in. mercury lamps. The cured coating had excellent gloss, abrasion resistance and adhesion and did not crack when the metal was stamped and formed.

The radiation curable composition of the instant invention can be used as a coating on various substrates including, but not limited to, glass, ceramic, concrete, metal, plastic, brick, paper, cardboard, wood, resilient flooring, e.g., vinyl and vinyl-asbestos tile and vinyl sheet goods, and the like. Coating thicknesses can range from 0.5 to 250 mils.

We claim:
1. A liquid radiation curable composition comprising
   (1) 10 to 80% by weight of an acrylic or methacrylic terminated, urethane containing polyene,
   (2) 5 to 60% by weight of a non-water soluble vinyl monomer diluent,
   (3) 0.1 to 35% by weight of a polythiol and
   (4) 0.01 to 10% by weight of a photoinitiator,
which forms a solid cured polythioether on exposure to actinic or high energy ionizing radiation.

2. The liquid radiation curable composition according to claim 1 wherein said polyene is prepared by reacting diisocyanate monomer with an ethylenically unsaturated alcohol in an amount such that one stoichiometric equivalent of diisocyanate groups remain in the reaction product and thereafter reacting said free isocyanate groups with the stoichiometric equivalent of the hydroxyl groups in a polyhydric alcohol.

3. The liquid radiation curable composition according to claim 2 wherein the diisocyanate is toluene diisocyanate, the ethylenically unsaturated alcohol is hydroxy propyl methacrylate and the polyhydric alcohol is polypropylene glycol having a molecular weight in the range 1,000 to 2,000.

4. The process of forming a printing plate which comprises exposing to actinic radiation projected through an image-bearing transparency selected portions of a radiation curable composition comprising
   (1) 10 to 80% by weight of an acrylic or methacrylic terminated, urethane containing polyene,
   (2) 5 to 60% by weight of a non-water soluble vinyl monomer diluent,
   (3) 0.1 to 35% by weight of a polythiol and
   (4) 0.01 to 10% by weight of a photoinitiator for a time sufficient to insolubilize the radiation curable composition in the exposed portions and thereafter removing the unexposed radiation curable composition.

5. The process of claim 4 wherein the radiation curable composition is adhered to a support layer during exposure to actinic radiation.

6. The process according to claim 4 wherein an air-gap from about 0.1 to about 250 mils is maintained between the image-bearing transparency and the radiation curable composition during exposure to actinic radiation.

7. The process of forming a coating on a substrate which comprises applying to the surface of a substrate a layer of a composition comprising
   (1) 10 to 80% by weight of an acrylic or methacrylic terminated, urethane containing polyene,
   (2) 5 to 60% by weight of a non-water soluble vinyl monomer diluent,
   (3) 0.1 to 35% by weight of a polythiol and (4) 0.01 to 10% by weight of a photoinitiator and thereafter exposing the layer to actinic radiation thereby curing said composition.

8. The process of forming a coating on a substrate which comprises applying to the surface of a substrate a layer of a composition comprising (1) 10 to 80% by weight of an acrylic or methacrylic terminated, urethane containing polyene,
(2) 5 to 60% by weight of a non-water soluble vinyl monomer diluent and
(3) 0.1 to 35% by weight of a polythiol and thereafter exposing the layer to high energy ionizing radiation thereby curing said composition.

* * * * *